United States Patent
Ju et al.

(10) Patent No.: US 10,122,111 B1
(45) Date of Patent: Nov. 6, 2018

(54) ELECTRICAL CONNECTOR

(71) Applicant: LOTES CO., LTD, Keelung (TW)

(72) Inventors: Ted Ju, Keelung (TW); Zuo Feng Jin, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/869,838

(22) Filed: Jan. 12, 2018

(30) Foreign Application Priority Data

Sep. 11, 2017 (CN) .......................... 2017 1 0812004
Oct. 19, 2017 (CN) .......................... 2017 1 0977656

(51) Int. Cl.
*H01R 13/24* (2006.01)
*H01R 12/70* (2011.01)

(52) U.S. Cl.
CPC ..... *H01R 13/2428* (2013.01); *H01R 12/7076* (2013.01); *H01R 13/2442* (2013.01)

(58) Field of Classification Search
CPC ............ H01R 13/2428; H01R 13/2448; H01R 13/245; H01R 13/2485; H01R 12/7076; H01R 12/71; H01R 12/714; H01R 12/716
See application file for complete search history.

(56) References Cited

U.S. PATENT DOCUMENTS

| | | | | |
|---|---|---|---|---|
| 7,878,823 B2 * | 2/2011 | Fan | ......................... | H01R 12/58 439/83 |
| 8,277,230 B2 * | 10/2012 | Huo | ..................... | H01R 12/716 439/342 |
| 8,535,093 B1 * | 9/2013 | Mason | ............... | H01R 13/6585 439/607.05 |
| 8,814,603 B2 * | 8/2014 | Chang | .................... | H01R 24/00 439/626 |
| 9,088,084 B2 * | 7/2015 | Liao | ....................... | H01R 13/41 |
| 9,142,915 B2 * | 9/2015 | Chang | ............... | H01R 13/2442 |
| 2012/0028502 A1 * | 2/2012 | Yeh | ........................ | H01R 12/57 439/626 |
| 2013/0267124 A1 * | 10/2013 | Chang | .................. | H01R 13/646 439/630 |

FOREIGN PATENT DOCUMENTS

| | | |
|---|---|---|
| CN | 1780057 A | 5/2006 |
| CN | 103378492 A | 10/2013 |
| CN | 103545646 A | 1/2014 |

* cited by examiner

*Primary Examiner* — Felix O Figueroa
(74) *Attorney, Agent, or Firm* — Locke Lord LLP; Tim Tingkang Xia, Esq.

(57) ABSTRACT

An electrical connector is used to be electrically connected with a chip module having multiple contact pads. The electrical connector includes an insulating body, provided with multiple accommodating grooves. Multiple terminals are accommodated in the accommodating grooves respectively. Each terminal has a main body portion located in a corresponding accommodating groove. An extending arm is connected with one end of the main body portion, and is used to be electrically connected with one of the contact pads upward. At least one metal connecting portion is provided on the insulating body and located at one side of the extending arm. One end of the metal connecting portion has an insulating supporting portion. The insulating supporting portion is used to abut the chip module upward, and is not in contact with or not electrically connected with the contact pads.

20 Claims, 8 Drawing Sheets

A-A

B-B

ELECTRICAL CONNECTOR

CROSS-REFERENCE TO RELATED PATENT APPLICATION

This non-provisional application claims priority to and the benefit of, pursuant to 35 U.S.C. § 119(a), patent application Serial No. CN201710812004.3 filed in China on Sep. 11, 2017 and patent application Serial No. CN201710977656.2 filed in China on Oct. 19, 2017. The disclosures of the above applications are incorporated herein in their entireties by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector, and more particularly to an electrical connector which prevents from excessive pressing of a chip module.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An existing electrical connector is used for electrically connecting a chip module to a circuit board, and achieving electrical conduction between the chip module and the circuit board in a pressing mode. In addition, the chip module is provided with contact pads to be conductively connected with the electrical connector. The electrical connector generally includes an insulating body and multiple conductive terminals accommodated in the insulating body. Each of the conductive terminals is provided with an elastic arm, and the elastic arm is provided with a contact portion to be electrically conductively connected with the contact pad of the chip module. The conductive terminals have good elasticity, and the chip module apply external pressing forces on the conductive terminals, so that the conductive terminals generate elastic deformation and then make abutting contacts with the contact pads of the chip module through the elastic forces of the conductive terminals, thereby allowing the conductive terminals to be electrically conductively connected with the contact pads of the chip module. The other ends of the conductive terminals away from the chip module are electrically conductively connected with the circuit board, thereby achieving the electrically conductive connection between the chip module and the circuit board. However, when the chip module presses the elastic arms, it is possible that the chip module excessively presses the elastic arms, such that the conductive terminals are damaged.

Currently, on the present market, to prevent the chip module from excessively pressing the terminals, a protrusion may be arranged on a surface of the insulating body. When the chip module presses the conductive terminals to a certain extent, the chip module abuts the protrusion, and the protrusion stops the chip module from further pressing, thus avoiding from excessive pressing to cause damage to the conductive terminals. However, with the continuous development of the electronic technology, the size and height of the electrical connector become increasingly smaller while the density of arrangement of the terminals becomes increasingly denser. In this case, the space for arranging the protrusion on the insulating body becomes increasingly smaller, and the difficulty is increasingly higher.

Therefore, a heretofore unaddressed need to design an improved electrical connector exists in the art to address the aforementioned deficiencies and inadequacies.

SUMMARY

In view of the problem addressed in the background technology, an objective of the present invention is to provide an electrical connector with a metal connecting portion arranged on an insulating body. The metal connecting portion has an insulating supporting portion. The insulating supporting portion is used for upward urging a chip module to stop the chip module from excessively pressing and damaging terminals.

To achieve the foregoing objective, the present invention adopts the following technical solutions.

An electrical connector is configured to be electrically connected with a chip module having a plurality of contact pads. The electrical connector includes: an insulating body, provided with a plurality of accommodating grooves; a plurality of terminals, accommodated in the accommodating grooves respectively, each of the terminals having a main body portion located in a corresponding one of the accommodating grooves, and an extending arm connected with one end of the main body portion, wherein the extending arm is configured to be electrically connected with one of the contact pads upward; and at least one metal connecting portion provided on the insulating body and located at one side of the extending arm, one end of the at least one metal connecting portion having an insulating supporting portion, wherein the insulating supporting portion is configured to abut the chip module upward.

In certain embodiments, the at least one metal connecting portion extends from the main body portion, and the end of the at least one metal connecting portion having the insulating supporting portion is away from the main body portion.

In certain embodiments, the at least one metal connecting portion and the extending arm respectively extend from the same end of the main body portion, and a material breaking portion extends from the main body portion and is located at a side of the extending arm away from the at least one metal connecting portion.

In certain embodiments, the at least one metal connecting portion extends vertically upward from the main body portion, and the at least one metal connecting portion, the insulating supporting portion and the main body portion are located on a same plane.

In certain embodiments, a projection of the insulating supporting portion and a projection of the extending arm along a vertical direction are partially overlapped, and the projection of the insulating supporting portion is partially overlapped with the corresponding one of the accommodating grooves.

In certain embodiments, the insulating supporting portion and the at least one metal connecting portion are integrally injection molded.

In certain embodiments, each of two sides of the main body portion has a step portion, each of two sides of the corresponding one of the accommodating grooves is provided with a fastening slot corresponding to the step portion, and the fastening slot stops the step portion.

In certain embodiments, at least one fastening portion vertically extends from one end of the main body portion away from the extending arm, and the at least one fastening portion is fastened on a lower surface of the insulating body.

In certain embodiments, the extending arm is formed by bending and extending from the one end of the main body portion, and the extending arm is provided with a contact portion being arc-shaped and configured to abut one of the contact pads upward.

In certain embodiments, when the chip module does not press the contact portion, a top surface of the contact portion is higher than a top surface of the insulating supporting portion; and when the chip module presses the contact portion downward in a direction toward the insulating body, the contact portion obliquely move downward in the direction toward the insulating body until the chip module abuts the insulating supporting portion, and the top surface of the contact portion and the top surface of the insulating supporting portion are located at a same horizontal height.

In certain embodiments, the at least one metal connecting portion and each of the terminals are separately formed, and the insulating supporting portion and the at least one metal connecting portion are located on a same plane.

In certain embodiments, the at least one metal connecting portion is provided with at least one projecting portion, and a lower surface of the at least one projecting portion is fastened on an upper surface of the insulating body.

In certain embodiments, a strip breaking portion extends vertically upward from the end of the at least one metal connecting portion connected with the insulating supporting portion.

In certain embodiments, a projection of the insulating supporting portion is partially overlapped with the corresponding one of the accommodating grooves along a vertical direction.

In certain embodiments, a lower surface of the insulating supporting portion abuts an upper surface of the main body portion.

In certain embodiments, at least one hook portion extends from an end of the at least one metal connecting portion away from the insulating supporting portion, and the at least one hook portions hook the lower surface of the insulating body.

Meanwhile, the present invention further provides another electrical connector, which is configured to be electrically connected with a chip module having a plurality of contact pads. The electrical connector includes: an insulating body, provided with a plurality of accommodating grooves; and a plurality of terminals, accommodated in the accommodating grooves respectively, each of the terminals having a main body portion located in a corresponding one of the accommodating grooves, and an extending arm connected with the main body portion, wherein the extending arm is configured to be electrically connected with one of the contact pads upward, one end of the main body portion is connected with a metal connecting portion, the metal connecting portion is located at one side of the extending arm, one end of the metal connecting portion has an insulating supporting portion, the insulating supporting portion is configured to abut the chip module upward, and the insulating supporting portion is not in contact with or not electrically connected with any of the contact pads.

In certain embodiments, the metal connecting portion extends vertically upwards from the main body portion, and the metal connecting portion, the insulating supporting portion and the main body portion are located on a same plane.

In certain embodiments, a projection of the insulating supporting portion and a projection of the extending arm along a vertical direction are partially overlapped, and the projection of the insulating supporting portion is partially overlapped with the corresponding one of the accommodating grooves.

In certain embodiments, the insulating supporting portions and the metal connecting portion are integrally injection molded.

Compared with the related art, the present invention according to certain embodiments of the present invention has the following beneficial effects.

The electrical connector is provided with the metal connecting portion on the insulating body. One end of the metal connecting portion has the insulating supporting portions, the insulating supporting portion is configured to abut the chip module upward, and the insulating supporting portion is not in contact with or not electrically connected with the contact pad. When the chip module presses the extending arm downward to a certain extent, the chip module abuts the insulating supporting portion, and the insulating supporting portion stops the chip module, thus preventing the chip module from excessively pressing the extending arm downward to damage the terminals.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
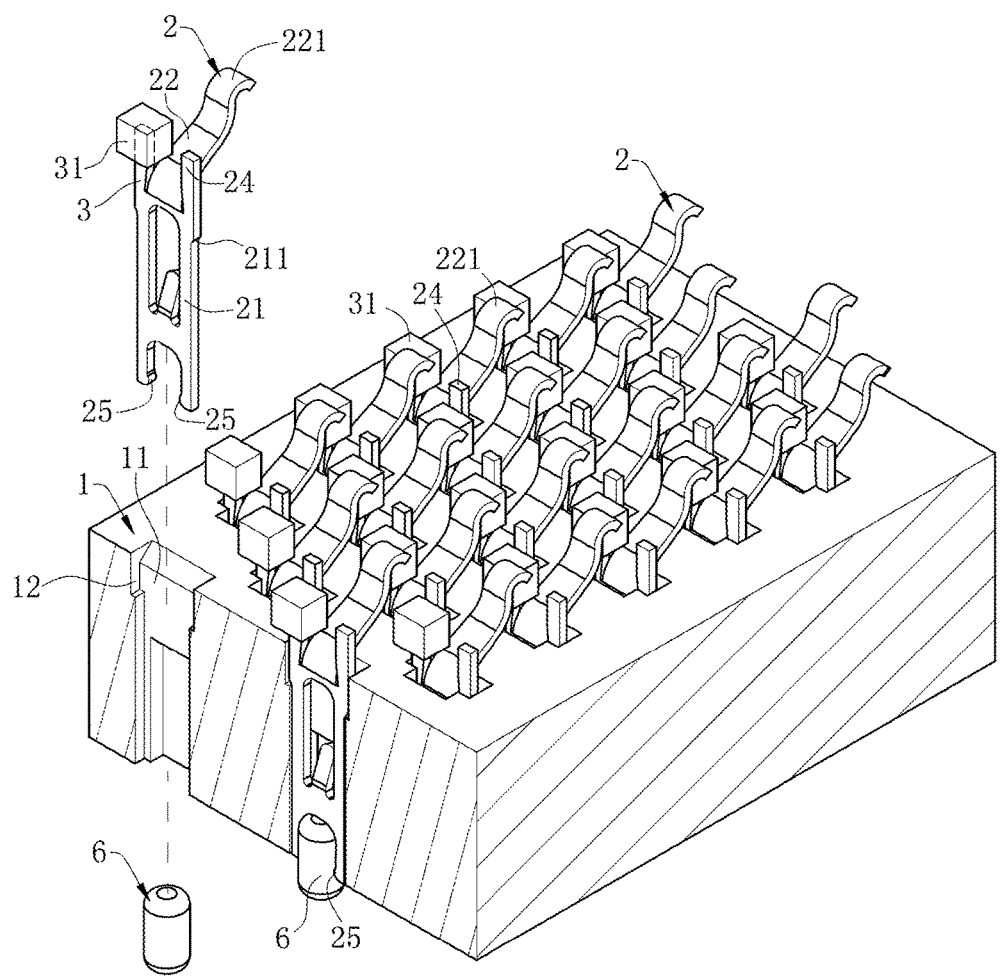
FIG. 1 is a perspective exploded view of an electrical connector according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-8. In accordance with the purposes of this invention, as embodied and broadly described herein, this invention, in one aspect, relates to an electrical connector.

Figure 4:
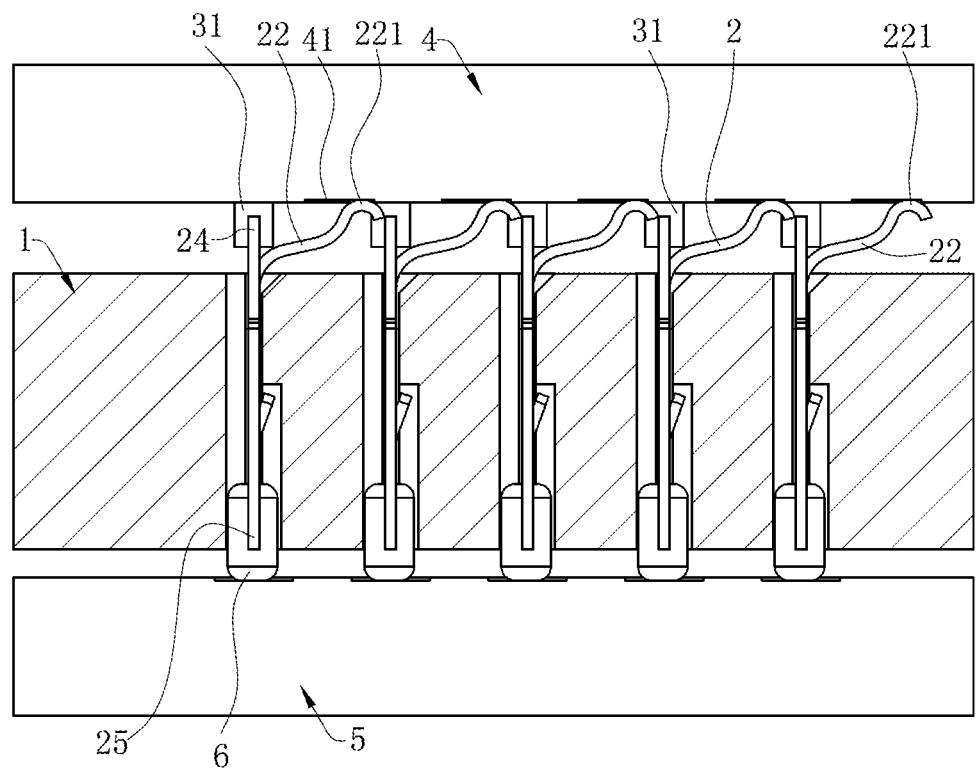
FIG. 4 is a sectional view of the electrical connector according to the first embodiment of the present invention in a B-B direction.

As shown in FIG. 1 and FIG. 4, an electrical connector 100 according to a first embodiment of the present invention is used to electrically connect a chip module 4 to a circuit board 5. The chip module 4 is provided with multiple contact pads 41. The electrical connector 100 includes an insulating body 1, multiple terminals 2 accommodated in the insulating body 1 respectively, and multiple metal connecting portions 3 provided on the insulating body 1 respectively.

Figure 2:
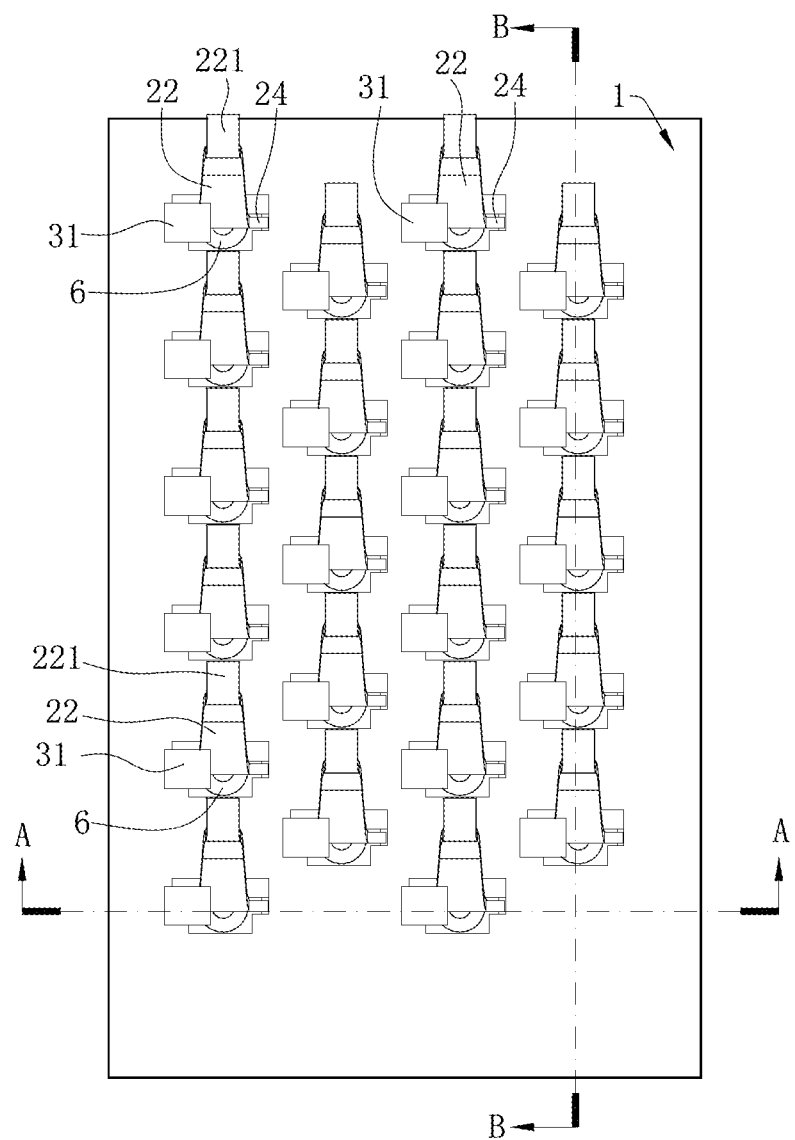
FIG. 2 is a top view of the electrical connector according to the first embodiment of the present invention.

As shown in FIG. 1 and FIG. 2, multiple accommodating grooves 11 are formed in the insulating body 1 penetratingly downward from top. The accommodating grooves 11 are distributed in the insulating body 1 staggeredly. The accommodating grooves 11 are arranged in multiple columns in a front-rear direction, and arranged in multiple rows in a left-right direction. Each of two sides of each of the accommodating grooves 11 is provided with a fastening slot 12. A plurality of positioning tables (not shown in the drawings, hereinafter inclusive) are around the insulating body 1. The positioning tables are used for positioning the chip module 4. An upper surface of each of the positioning tables is higher than an upper surface of the insulating body 1.

As shown in FIG. 1 and FIG. 4, each terminal 2 has a main body portion 21, which is located in a corresponding accommodating groove 11. An extending arm 22 is formed by bending and extending upward from one end of the main body portion 21. The extending arm 22 extends beyond the upper surface of the insulating body 1 upward and is used to be electrically connected with the contact pads 41. The extending arm 22 has an arc-shaped contact portion 221, and the contact portion 221 is used to abut the contact pad 41 upward. A material breaking portion 24 extends from the main body portion 21 and is located at the side of the extending arm 22 away from the metal connecting portion 3. The material breaking portion 24 and the extending arm 22 are connected with the same end of the main body portion 21 correspondingly. A clamping portion 25 is arranged at the other end of the main body portion 21, and the clamping portions 25 clamps a solder post 6 and is electrically connected with the circuit board 5.

Figure 3:
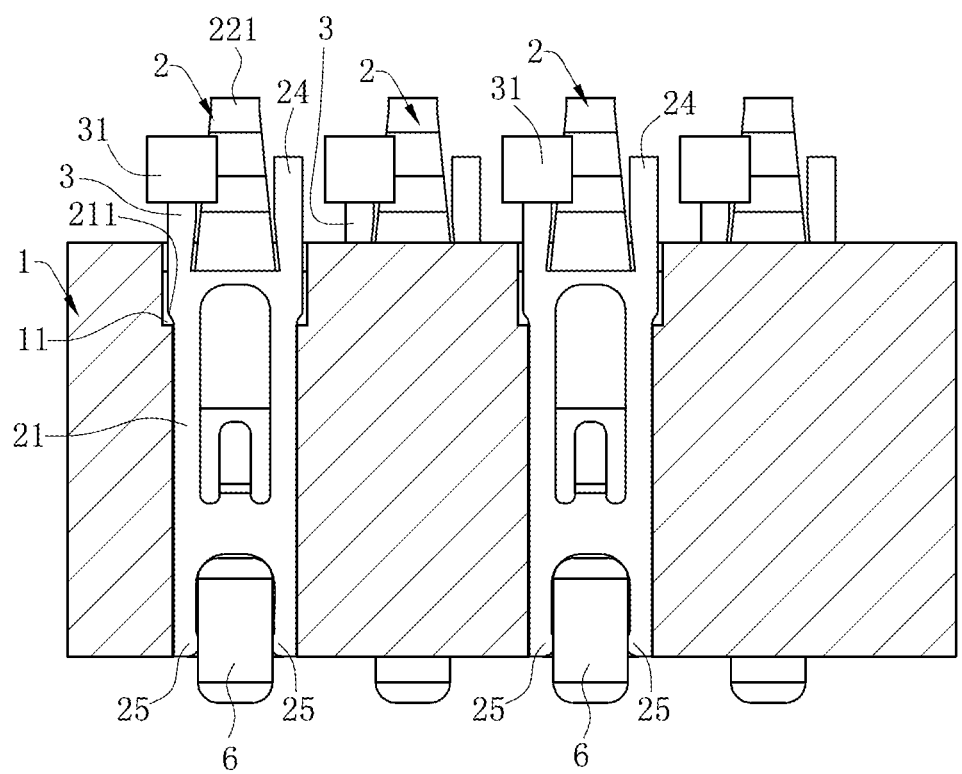
FIG. 3 is a sectional view of the electrical connector according to the first embodiment of the present invention in an A-A direction.

As shown in FIG. 3, each of two sides of the main body portion 21 has a step portion 211. The step portion 221 is fastened into a corresponding fastening slot 12 to stop the terminal 2 from moving downward.

As shown in FIG. 1 and FIG. 3, multiple metal connecting portions 3 are provided. Each metal connecting portion 3 and a corresponding terminal 2 are integrally formed. Each metal connecting portion 3 and the corresponding extending arm 22 extend from the same end of the corresponding main body portion 21. Each metal connecting portion 3 extends vertically upward from one end of the main body portion 21. The metal connecting portion 3 is located at one side of the corresponding extending arm 22. An end of each metal connecting portion 3 away from the main body portion 21 has an insulating supporting portion 31. The insulating supporting portion 31 and the metal connecting portion 3 are integrally injection molded. The main body portion 21, the metal connecting portion 3 and the insulating supporting portion 31 are located on the same plane. The insulating supporting portion 31 is used to abut the chip module 4 upward, and is not in contact with or not electrically connected with the contact pads 41 (as shown in FIG. 4).

A projection of the insulating supporting portion 31 and a projection of the extending arms 22 along the vertical direction are partially overlapped (as shown in FIG. 2). Compared with an existing electrical connector where the projection of the insulating supporting portion and the projection of the extending arms along the vertical direction are staggered, the insulating supporting portion 31 of the electrical connector 100 according to the present embodiment can fully use the space above the extending arm 22, thus increasing the area of the insulating supporting portion 31, and allowing the insulating supporting portion 31 to support the chip module 4 more stably.

A top surface of the material breaking portion 24 is lower than a top surface of the insulating supporting portion 31. The terminals 2 are arranged in multiple columns from front to back, and projections of each two adjacent columns of the terminals 2 along a front-rear direction are not overlapped (as shown in FIG. 3). Compared with the existing electrical connector where multiple terminals are arranged in a staggered mode, strips of the terminals 2 of the electrical connector 100 according to the present embodiment do not scrape objects around the terminals 2 when the strips of the terminals 2 are broken.

As shown in FIG. 3 and FIG. 4, when the chip module 4 does not press the contact portion 221, the distance between the top surface of the contact portion 221 and an upper surface of the insulating body 1 in a vertical direction is A, the distance between the top surface of the insulating supporting portion 31 and the upper surface of the insulating body 1 in the vertical direction is B, and A is greater than B. When the chip module 4 presses the contact portion 221 downward in a direction toward the insulating body 1, the contact portion 221 is electrically connected with the contact pad 41, such that the contact portion 221 moves obliquely downward in the direction toward the insulating body 1 until the chip module 4 abuts the insulating supporting portions 31, and the insulating supporting portions 31 are not in contact with or not electrically connected with any of the contact pads 41. At this time, the top surface of the contact portion 221 and the top surface of the insulating supporting portion 31 are located at the same horizontal height, thus preventing the chip module 4 from excessively pressing the extending arms 22 downward to damage the terminals 2.

Figure 5:
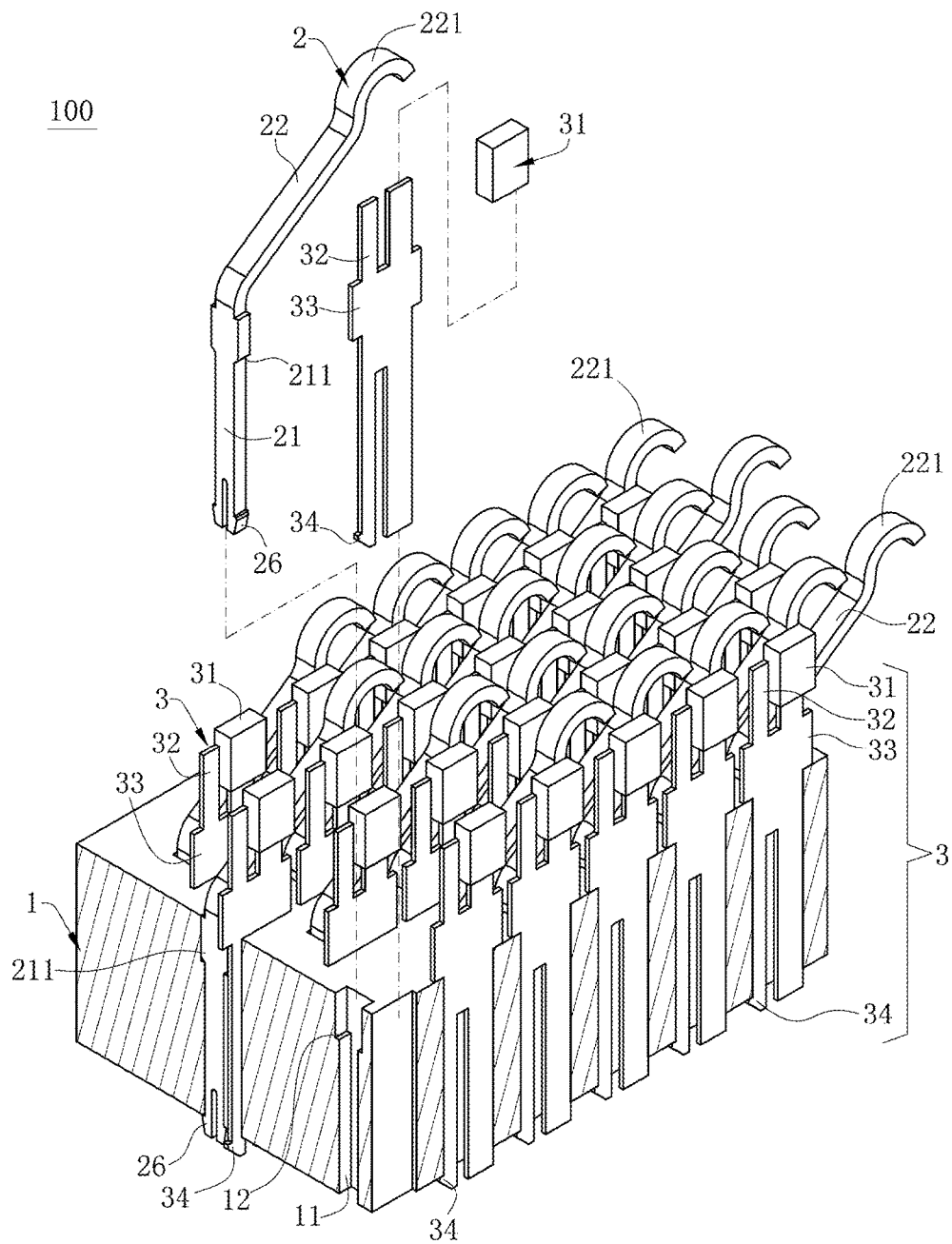
FIG. 5 is a perspective exploded view of an electrical connector according to a second embodiment of the present invention.
Figure 6:
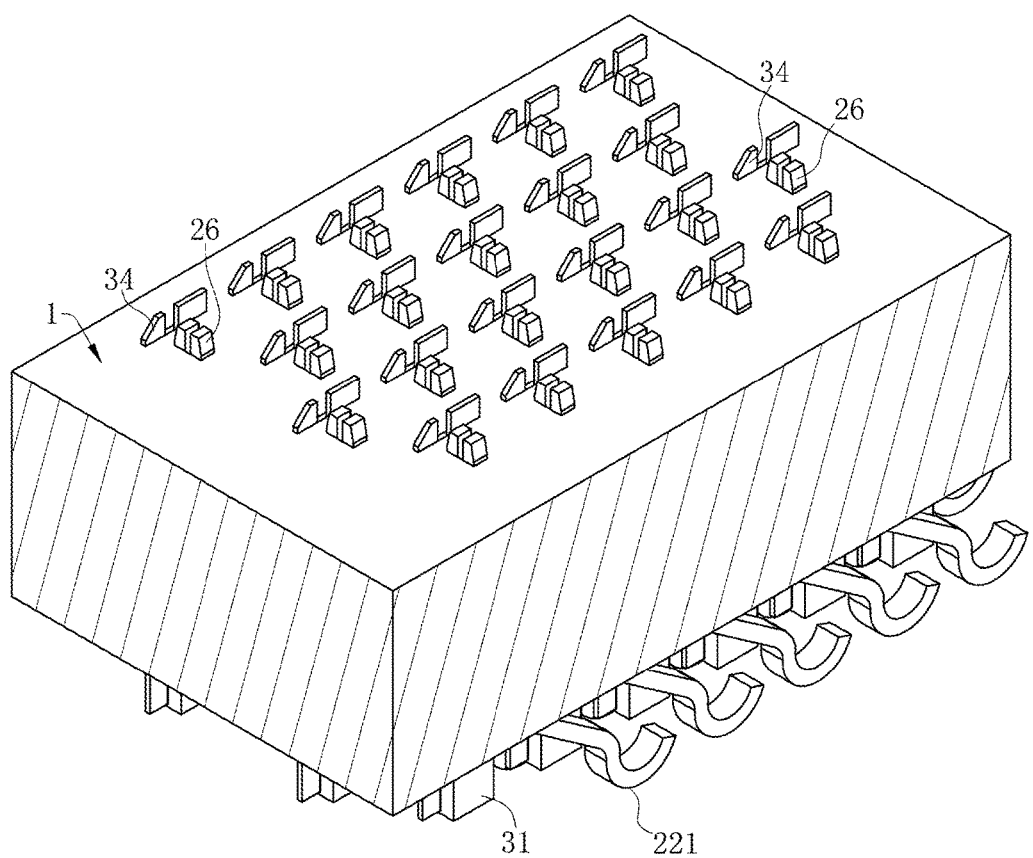
FIG. 6 is a perspective assembled view of the electrical connector according to the second embodiment of the present invention from another viewing angle.

FIG. 5 and FIG. 6 show a second embodiment of the present invention. The second embodiment is different from the first embodiment in that each of the metal connecting portions 3 and each of the terminals 2 are separately molded, and each of the metal connecting portions 3 is inserted into the insulating body 1 and located at one side of the extending arm 22. One end of each of the metal connecting portions 3 has an insulating supporting portion 31, and the insulating supporting portion 31 is used to abut the chip module 4 and is not in contact with or not electrically connected with any of the contact pads 41.

Each of the metal connecting portions 3 has two projecting portions 33. A lower surface of each of the projecting portions 33 is fastened on the upper surface of the insulating body 1 to stop the metal connecting portion 3 from moving downward. A strip breaking portion 32 extends vertically upward from the end of the metal connecting portion 3 connected with the insulating supporting portion 31. A hook portion 34 extends from the end of the metal connecting portion 3 away from the insulating supporting portion 31. The hook portion 34 hooks the lower surface of the insulating body 1 to prevent the metal connecting portion 3 from moving upward. The metal connecting portion 3, the projecting portions 33, the strip breaking portion 32 and the hook portion 34 are located on the same plane. A projection of the insulating supporting portion 31 is partially overlapped with a corresponding accommodating groove 11 along the vertical direction. Compared with the existing electrical connector where the projection of the insulating supporting portion and the corresponding accommodating groove are arranged in a staggered mode, the insulating supporting portion 31 of the electrical connector 100 according to the present embodiment can fully use the space above the accommodating grooves 11, thus increasing the area of the insulating supporting portion 31.

Two fastening portions 26 extend vertically from the end of the main body portion 21 away from the extending arm 22. The fastening portions 26 are fastened to the lower surface of the insulating body 1 to prevent the terminals 2 from moving upward.

Figure 7:
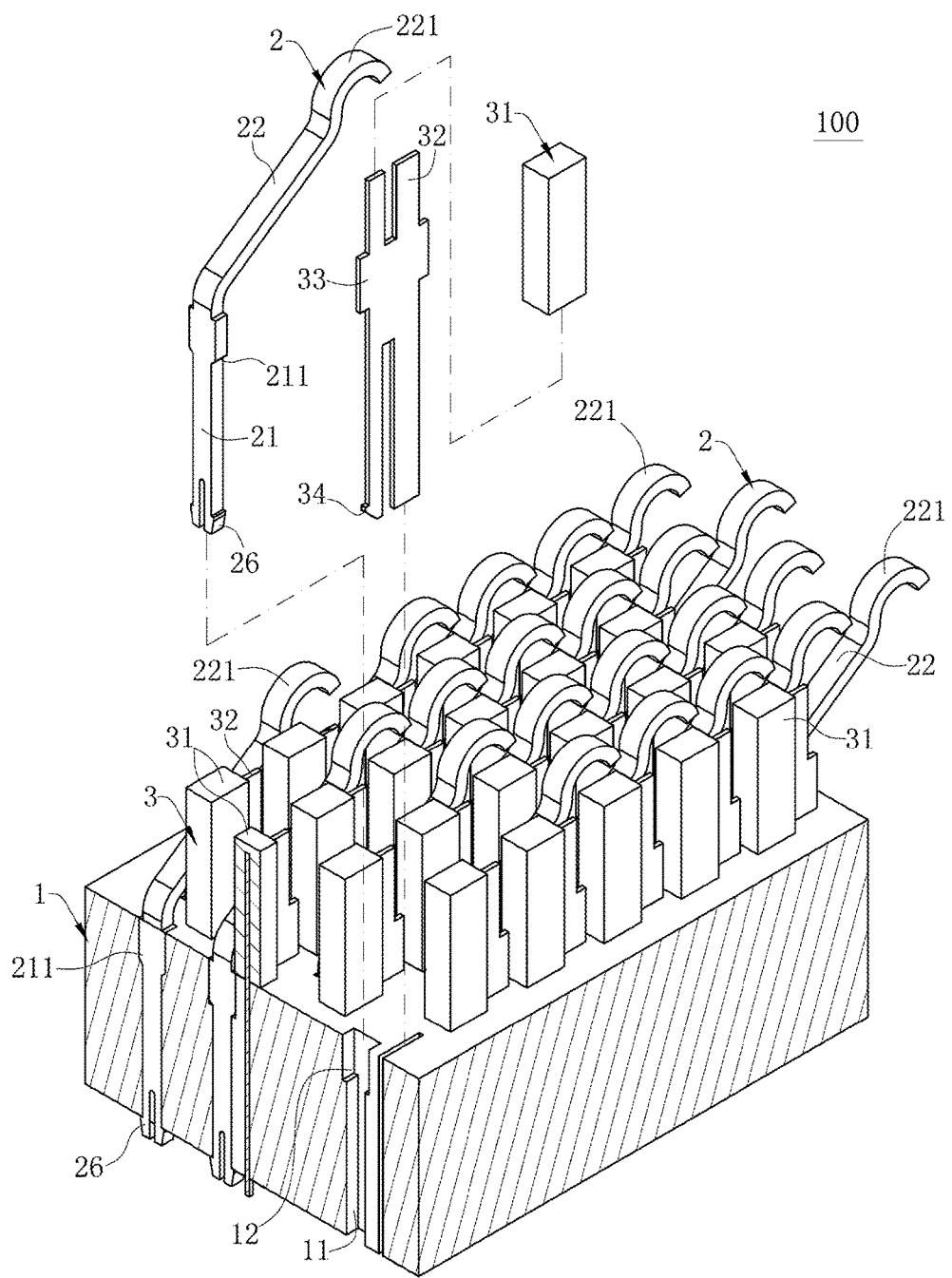
FIG. 7 is a perspective exploded view of an electrical connector according to a third embodiment of the present invention.
Figure 8:
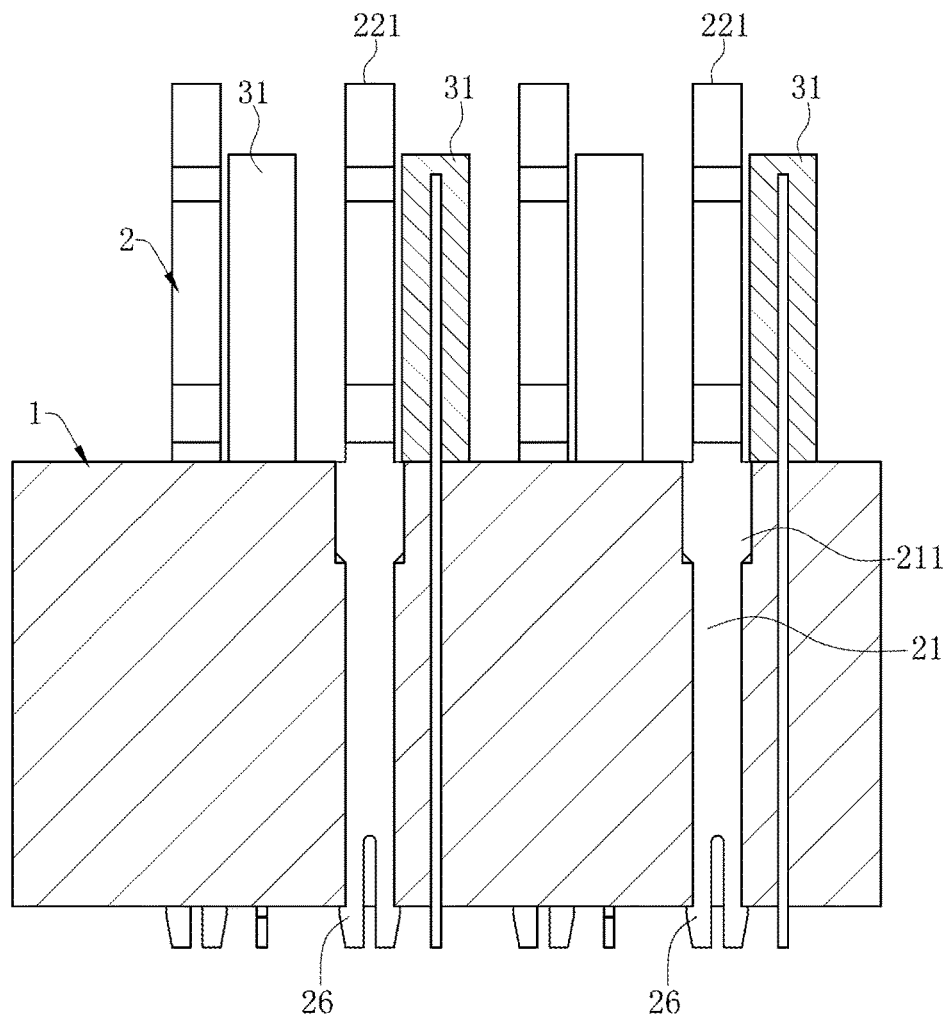
FIG. 8 is a perspective assembled view of an electrical connector according to a third embodiment of the present invention from another viewing angle.

FIG. 7 and FIG. 8 show a third embodiment of the present invention. The third embodiment is different from the second embodiment in that the lower surfaces of the insulating supporting portions 31 abut the upper surface of the main body portion 21 to stop the main body portion 21 from moving upward. Meanwhile, the insulating supporting portion 31 is located above the main body portion 21. Compared with the existing electrical connector 100 where the insulating supporting portion 31 and the main body portion 21 are arranged in a staggered mode, the insulating supporting portion 31 of the electrical connector 100 according to the embodiment can fully use the space above the main body portion 21, thus increasing the area of the insulating supporting portion 31, and allowing the insulating supporting portion 31 to support a chip module 4 more stably.

To sum up, the electrical connector 100 according to certain embodiments of the present invention has the following beneficial effects:

(1) According to the electrical connector 100 of the present invention, the metal connecting portions 3 are arranged on the insulating body 1. One end of each of the metal connecting portions 3 has an insulating supporting portion 31, which is used to abut the chip module 4 upward, and is not in contact with or not electrically connected with any of the contact pads 41. When the chip module 4 presses the extending arms 22 downward to a certain extent, the chip module 4 abuts the insulating supporting portion 31, and the insulating supporting portion 31 stops the chip module 4, thereby preventing the chip module 4 from excessively pressing the extending arm 22 downward to damage the terminals 2.

(2) Each of the two sides of the main body portion 21 has a step portion 211, and the step portion 221 is fastened into a corresponding fastening slot 12 to stop the terminal 2 from moving downward.

(3) The insulating supporting portion 31 and the metal connecting portion 3 are integrally injection molded. The insulating supporting portions 31 are used to abut the chip module 4 and are not in contact with or not electrically connected with any of the contact pads 41. The insulating supporting portion 31 is made from an insulating material, such that short circuiting of the electrical connector 100 does not occur even through the insulating supporting portions 31 are in contact with the contact pads 41.

(4) The projection of the insulating supporting portion 31 and the projection of the extending arm 22 along the vertical direction are partially overlapped. Compared with the existing electrical connector where the projection of the insulating supporting portion and the projection of the extending arms along the vertical direction are staggered, the insulating supporting portion 31 in the electrical connector 100 according to the present embodiment can fully use the space above the extending arm 22, thus increasing the area of the insulating supporting portion 31, and allowing the insulating supporting portions 31 to support the chip module 4 more stably.

(5) The terminals 2 are arranged in multiple columns from front to back, and the projections of each two adjacent columns of the terminals 2 in the front-rear direction are not overlapped. Compared with the existing electrical connector where multiple terminals are arranged in a staggered mode, strips of the terminals 2 of the electrical connector 100 according to the present embodiment do not scrape objects around the terminals 2 when the strips of the terminals 2 are broken;

(6) In the second embodiment, each of the metal connecting portions 3 and each of the terminals 2 are separately molded, and each of the metal connecting portions 3 is inserted into the insulating body 1 and located at one side of the extending arm 22. One end of each of the metal connecting portions 3 has an insulating supporting portion 31, and the insulating supporting portion 31 is used to abut the chip module 4 and is not in contact with or not electrically connected with any of the contact pads 41. Each of the metal connecting portions 3 is smaller in its width. That is, the space of the insulating body 1 occupied by the metal connecting portions 3 is small. Each of the insulating supporting portions 31 is inserted into the insulating body 1 by means of the metal connecting portion 3. Since the insulating supporting portions 31 do not occupy any space of the insulating body 1, the insulating supporting portions 31 can be made larger, so that the insulating supporting portions 31 support the chip module 4 more stably.

(7) In the third embodiment, the lower surface of the insulating supporting portion 31 abuts the upper surface of the main body portion 21 to stop the main body portion 21 from moving upward. Meanwhile, the insulating supporting portion 31 is located above the main body portion 21. Compared with the existing electrical connector where the insulating supporting portion and the main body portion are arranged in a staggered mode, the insulating supporting portion 31 of the electrical connector 100 according to the present embodiment can fully use the space above the main body portion 21, thus increasing the area of the insulating supporting portion 31, and allowing the insulating supporting portion 31 to support a chip module 4 more stably.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, configured to be electrically connected with a chip module having a plurality of contact pads, the electrical connector comprising:
    an insulating body, provided with a plurality of accommodating grooves;
    a plurality of terminals, accommodated in the accommodating grooves respectively, each of the terminals having a main body portion located in a corresponding one of the accommodating grooves, and an extending arm connected with one end of the main body portion, wherein the extending arm is configured to be electrically connected with one of the contact pads upward; and
    at least one metal connecting portion provided on the insulating body and located at one side of the extending arm, one end of the at least one metal connecting portion having an insulating supporting portion that is discrete from the insulating body and extends upward beyond the at least one metal connecting portion, wherein the insulating supporting portion is configured to abut the chip module upward.

2. The electrical connector according to claim 1, wherein the at least one metal connecting portion extends from the main body portion, and the end of the at least one metal connecting portion having the insulating supporting portion is away from the main body portion.

3. The electrical connector according to claim 2, wherein the at least one metal connecting portion and the extending arm respectively extend from the same end of the main body portion, and a material breaking portion extends from the main body portion and is located at a side of the extending arm away from the at least one metal connecting portion.

4. The electrical connector according to claim 2, wherein the at least one metal connecting portion extends vertically upward from the main body portion, and the at least one metal connecting portion, the insulating supporting portion and the main body portion are located on a same plane.

5. The electrical connector according to claim 2, wherein a projection of the insulating supporting portion and a projection of the extending arm along a vertical direction are partially overlapped, and the projection of the insulating supporting portion is partially overlapped with the corresponding one of the accommodating grooves.

6. The electrical connector according to claim 1, wherein the insulating supporting portion and the at least one metal connecting portion are integrally injection molded.

7. The electrical connector according to claim 1, wherein each of two sides of the main body portion has a step portion, each of two sides of the corresponding one of the accommodating grooves is provided with a fastening slot corresponding to the step portion, and the fastening slot stops the step portion.

8. The electrical connector according to claim 1, wherein at least one fastening portion vertically extends from one end of the main body portion away from the extending arm, and the at least one fastening portion is fastened on a lower surface of the insulating body.

9. The electrical connector according to claim 1, wherein the extending arm is formed by bending and extending from the one end of the main body portion, and the extending arm is provided with a contact portion being arc-shaped and configured to abut one of the contact pads upward.

10. The electrical connector according to claim 9, wherein:
    when the chip module does not press the contact portion, a top surface of the contact portion is higher than a top surface of the insulating supporting portion; and
    when the chip module presses the contact portion downward in a direction toward the insulating body, the contact portion obliquely move downward in the direction toward the insulating body until the chip module abuts the insulating supporting portion, and the top surface of the contact portion and the top surface of the insulating supporting portion are located at a same horizontal height.

11. The electrical connector according to claim 1, wherein the at least one metal connecting portion and each of the terminals are separately formed, and the insulating supporting portion and the at least one metal connecting portion are located on a same plane.

12. The electrical connector according to claim 11, wherein the at least one metal connecting portion is provided with at least one projecting portion, and a lower surface of the at least one projecting portion is fastened on an upper surface of the insulating body.

13. The electrical connector according to claim 12, wherein a strip breaking portion extends vertically upward from the end of the at least one metal connecting portion connected with the insulating supporting portion.

14. The electrical connector according to claim 11, wherein a projection of the insulating supporting portion is partially overlapped with the corresponding one of the accommodating grooves along a vertical direction.

15. The electrical connector according to claim 11, wherein a lower surface of the insulating supporting portion abuts an upper surface of the main body portion.

16. The electrical connector according to claim 11, wherein at least one hook portion extends from an end of the at least one metal connecting portion away from the insulating supporting portion, and the at least one hook portions hook the lower surface of the insulating body.

17. An electrical connector, configured to be electrically connected with a chip module having a plurality of contact pads, the electrical connector comprising:
   an insulating body, provided with a plurality of accommodating grooves; and
   a plurality of terminals, accommodated in the accommodating grooves respectively, each of the terminals having a main body portion located in a corresponding one of the accommodating grooves, and an extending arm connected with the main body portion, wherein the extending arm is configured to be electrically connected with one of the contact pads upward, one end of the main body portion is connected with a metal connecting portion, the metal connecting portion is located at one side of the extending arm, one end of the metal connecting portion has an insulating supporting portion insulating support portion that is discrete from the insulating body and extends upward beyond the metal connecting portion, the insulating supporting portion is configured to abut the chip module upward.

18. The electrical connector according to claim 17, wherein the metal connecting portion extends vertically upwards from the main body portion, and the metal connecting portion, the insulating supporting portion and the main body portion are located on a same plane.

19. The electrical connector according to claim 17, wherein a projection of the insulating supporting portion and a projection of the extending arm along a vertical direction are partially overlapped, and the projection of the insulating supporting portion is partially overlapped with the corresponding one of the accommodating grooves.

20. The electrical connector according to claim 17, wherein the insulating supporting portions and the metal connecting portion are integrally injection molded.

\* \* \* \* \*